(12) United States Patent
Shiroishi et al.

(10) Patent No.: US 10,607,339 B2
(45) Date of Patent: Mar. 31, 2020

(54) IMAGE PROCESSING APPARATUS

(71) Applicant: TOSHIBA MEDICAL SYSTEMS CORPORATION, Otawara-shi, Tochigi (JP)

(72) Inventors: Ryo Shiroishi, Tochigi (JP); Masao Yui, Tochigi (JP)

(73) Assignee: TOSHIBA MEDICAL SYSTEMS CORPORATION, Otawara-Shi, Tochigi (JP)

(*) Notice: Subject to any disclaimer, the term of this patent is extended or adjusted under 35 U.S.C. 154(b) by 134 days.

(21) Appl. No.: 15/341,371

(22) Filed: Nov. 2, 2016

(65) Prior Publication Data
US 2017/0154419 A1 Jun. 1, 2017

(30) Foreign Application Priority Data
Nov. 27, 2015 (JP) ................... 2015-232445

(51) Int. Cl.
*G06K 9/00* (2006.01)
*G06T 7/00* (2017.01)
*G01R 33/50* (2006.01)
*G01R 33/56* (2006.01)
*G06T 5/00* (2006.01)
*G06T 11/00* (2006.01)
*G01R 33/561* (2006.01)

(52) U.S. Cl.
CPC ............ *G06T 7/0012* (2013.01); *G01R 33/50* (2013.01); *G01R 33/5602* (2013.01); *G06T 5/009* (2013.01); *G06T 11/006* (2013.01); *G01R 33/5618* (2013.01); *G06T 2207/10096* (2013.01); *G06T 2207/20208* (2013.01)

(58) Field of Classification Search
CPC ................ G01R 33/50; G01R 33/5602; G01R 33/5618; G06T 7/0012
See application file for complete search history.

(56) References Cited

U.S. PATENT DOCUMENTS

| 7,907,760 B2* | 3/2011 | Doyle ................ G01R 33/5611 324/307 |
| 2014/0226890 A1* | 8/2014 | O'Brien ............ G01R 33/5608 382/131 |
| 2014/0303478 A1 | 10/2014 | Roche et al. | |

OTHER PUBLICATIONS

Marques, José P., et al. "MP2RAGE, a self bias-field corrected sequence for improved segmentation and T1-mapping at high field." Neuroimage 49.2 (2010): 1271-1281.*
O'Brien, Kieran R., et al. "Robust T1-weighted structural brain imaging and morphometry at 7T using MP2RAGE." PloS one 9.6 (2014): e99676. (Year: 2014).*
(Continued)

*Primary Examiner* — Avinash Yentrapati
(74) *Attorney, Agent, or Firm* — Nixon & Vanderhye P.C.

(57) ABSTRACT

An image processing apparatus according to an embodiment includes processing circuitry. The processing circuitry is configured to obtain one or more complex product signal values each indicating a signal value of a complex product and a complex ratio signal value indicating a signal value of a complex ratio calculated in units of pixels by using first data and second data successively acquired by implementing a gradient echo method after an Inversion Recovery (IR) pulse is applied and to derive a T1 value of each of the pixels from one of the complex product signal values selected on the basis of the obtained complex ratio signal value.

8 Claims, 11 Drawing Sheets

(56) References Cited

OTHER PUBLICATIONS

Marques, Jose P., and Rolf Gruetter. "New developments and applications of the MP2RAGE sequence-focusing the contrast and high spatial resolution R1 mapping." PloS one 8.7 (2013): e69294. (Year: 2013).*

Marques et al., "MP2RAGE, a self-bias field corrected sequence for improved segmentation at high field", Proc. Intl. Soc. Mag. Reson. Med. 16 (2008) 1 page.

Marques et al., "MP2RAGE, a self bias-field corrected sequence for improved segmentation and T1-mapping at high field", NeuroImage 49 (2010) pp. 1271-1281.

* cited by examiner

IMAGE PROCESSING APPARATUS

CROSS-REFERENCE TO RELATED APPLICATIONS

This application is based upon and claims the benefit of priority from Japanese Patent Application No. 2015-232445, filed on Nov. 27, 2015; the entire contents of which are incorporated herein by reference.

FIELD

Embodiments described herein relate generally to an image processing apparatus.

BACKGROUND

Conventionally, a method is known by which a T1 map, which is an image of T1 values indicating longitudinal relaxation time of a tissue, is generated by using a Magnetic Resonance Imaging (MRI) apparatus. To generate the T1 map, a predetermined algorithm is used for performing an acquiring process and a reconstructing process for that purpose, as well as a calculating process to calculate the T1 values by analyzing a reconstructed image. Methods that can be implemented over the processes from the acquiring process through the analyzing process are called T1 mapping methods. For instance, known examples of the T1 mapping methods include an Inversion Recovery (IR) method and a Variable Flip Angle (VFA) method.

Further, in recent years, apparatuses having a higher magnetic field strength such as 3T (Tesla)-MRI apparatuses are also in practical use. Accordingly, T1 mapping methods that are less easily influenced by spatial non-uniformity of Radio Frequency (RF) transmission pulses have been proposed, the spatial non-uniformity being more significant in magnetic fields having higher magnetic field strengths. Known examples of such T1 mapping methods include a Magnetization-Prepared 2 Rapid Acquisition Gradient Echoes (MP2RAGE) method.

DETAILED DESCRIPTION

An image processing apparatus according to an embodiment includes processing circuitry. The processing circuitry is configured to obtain one or more complex product signal values each indicating a signal value of a complex product and a complex ratio signal value indicating a signal value of a complex ratio calculated in units of pixels by using first data and second data successively acquired by implementing a gradient echo method after an Inversion Recovery (IR) pulse is applied and to derive a T1 value of each of the pixels from one of the complex product signal values selected on the basis of the obtained complex ratio signal value.

First Embodiment

Figure 1:
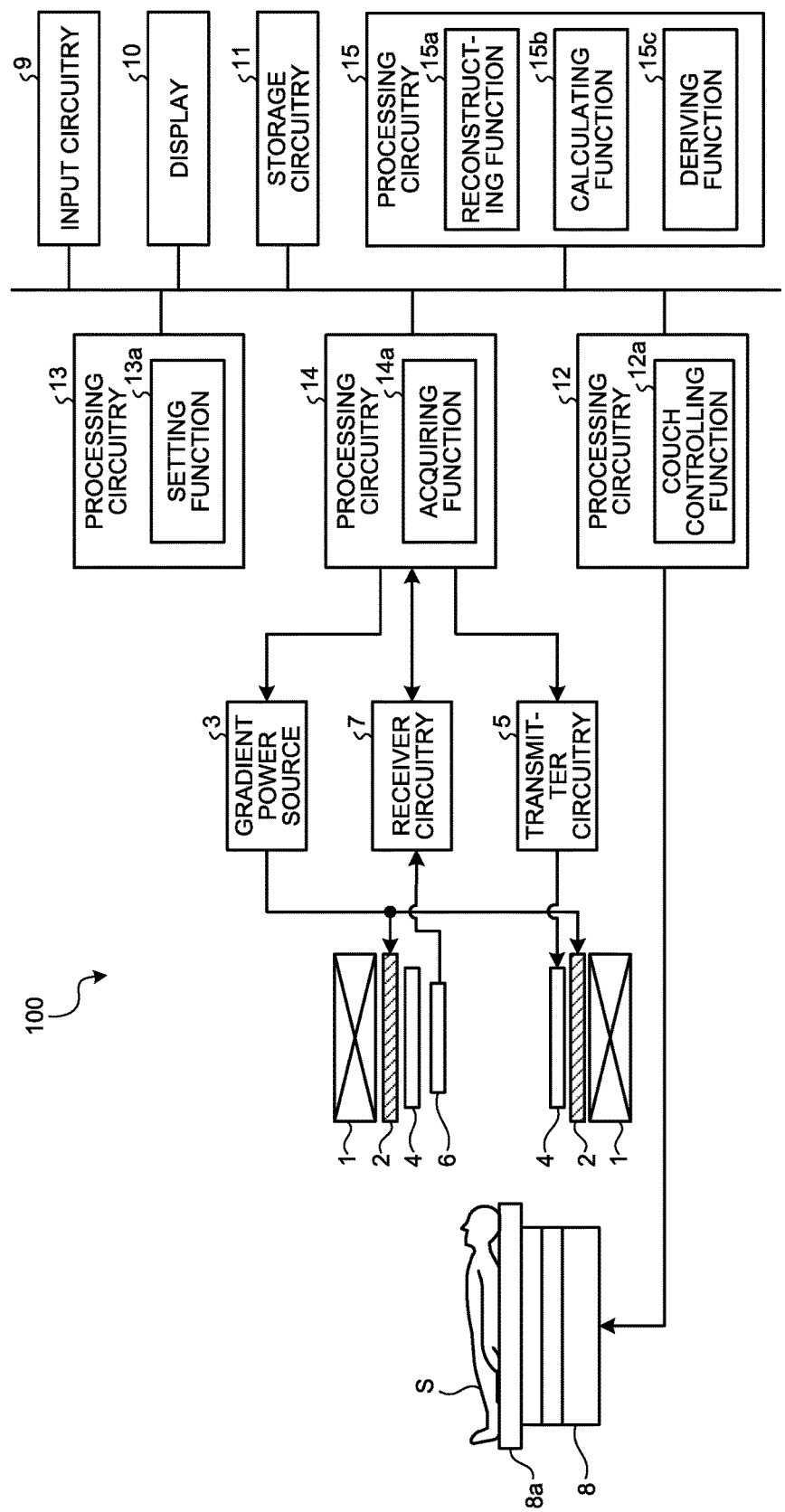
FIG. 1 is a diagram of an exemplary configuration of an MRI apparatus according to a first embodiment.

FIG. 1 is a diagram illustrating an exemplary configuration of an MRI apparatus according to a first embodiment. For example, as illustrated in FIG. 1, an MRI apparatus 100 includes a magnetostatic field magnet 1, a gradient coil 2, a gradient power source 3, a transmitter coil 4, transmitter circuitry 5, a receiver coil 6, receiver circuitry 7, a couch 8, input circuitry 9, a display 10, storage circuitry 11, and processing circuitries 12 to 15.

The magnetostatic field magnet 1 is formed to have a hollow and substantially circular cylindrical shape (which may have an oval cross-section orthogonal to the central axis thereof) and is configured to generate a uniform magnetostatic field in an image taking space formed on the inner circumferential side thereof. For example, the magnetostatic field magnet 1 may be realized with a permanent magnet, a superconductive magnet, or the like.

The gradient coil 2 is formed to have a hollow and substantially circular cylindrical shape (which may have an oval cross-section orthogonal to the central axis thereof) and is disposed on the inner circumferential side of the magnetostatic field magnet 1. The gradient coil 2 includes three coils configured to generate gradient magnetic fields along x-, y-, and z-axes, respectively, that are orthogonal to one another. In this situation, the x-axis, the y-axis, and the z-axis structure an apparatus coordinate system unique to the MRI apparatus 100. For example, the x-axis direction is set in the vertical direction, whereas the y-axis direction is set in the horizontal direction. Further, the z-axis direction is set so as to be the same as the direction of a magnetic flux in the magnetostatic field generated by the magnetostatic field magnet 1.

By individually supplying an electric current to each of the three coils included in the gradient coil 2, the gradient power source 3 is configured to cause the gradient magnetic fields to be generated along the x-, y-, and z-axes, in the image taking space. The gradient power source 3 is able to cause the gradient magnetic fields to be generated along a read-out direction, a phase-encoding direction, and a slice direction that are orthogonal to one another, by generating the gradient magnetic fields along the x-, y-, and z-axes, as appropriate. In this situation, the axes extending along the read-out direction, the phase-encoding direction, and the slice direction structure a logical coordinate system used for defining slice regions or a volume region serving as a target of an image taking process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

In the present example, the gradient magnetic fields are superimposed on the magnetostatic field generated by the magnetostatic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an image taking region is represented by slice regions, the slice gradient magnetic field is used for determining the orientations, the thicknesses, and the quantity of the slice regions. In contrast, when the image taking region is represented by a volume region, the slice gradient magnetic field appends position information along the slice direction to an MR signal, by varying the phase of the MR signal in accordance with the position in the slice direction.

The transmitter coil 4 is formed to have a hollow and substantially circular cylindrical shape (which may have an oval cross-section orthogonal to the central axis thereof) and is disposed on the inside of the gradient coil 2. The transmitter coil 4 is configured to apply a Radio Frequency (RF) pulse output from the transmitter circuitry 5 to the image taking space.

The transmitter circuitry 5 is configured to output the RF pulse corresponding to a Larmor frequency to the transmitter coil 4. For example, the transmitter circuitry 5 includes an oscillation circuit, a phase selecting circuit, a frequency converting circuit, an amplitude modulating circuit, and an RF amplifying circuit. The oscillation circuit is configured to generate an RF pulse having a resonant frequency unique to a targeted atomic nucleus placed in the magnetostatic field. The phase selecting circuit is configured to select a phase of the RF pulse output from the oscillation circuit. The frequency converting circuit is configured to convert the frequency of the RF pulse output from the phase selecting circuit. The amplitude modulating circuit is configured to modulate the amplitude of the RF pulse output from the frequency converting circuit, according to a sinc function, for example. The RF amplifying circuit is configured to amplify the RF pulse output from the amplitude modulating circuit and to output the amplified RF pulse to the transmitter coil 4.

The receiver coil 6 is an RF coil configured to receive MR signals emitted from an examined subject (hereinafter, "patient") S. More specifically, the receiver coil 6 is an RF coil attached to the patient S placed in the image taking space and configured to receive the MR signals emitted from the patient S due to an influence of the RF magnetic field applied by the transmitter coil 4. Further, the receiver coil 6 is configured to output the received MR signals to the receiver circuitry 7. For example, as the receiver coil 6, an exclusively-used coil is employed for each site serving as an image taking target. In this situation, the exclusively-used coil may be, for example, a receiver coil for the head, a receiver coil for the neck, a receiver coil for a shoulder, a receiver coil for the chest, a receiver coil for the abdomen, a receiver coil for a leg, a receiver coil for the spine, or the like.

The receiver circuitry 7 is configured to generate MR signal data on the basis of the MR signals output from the receiver coil 6 and to output the generated MR signal data to the processing circuitry 13. For example, the receiver circuitry 7 includes a selecting circuit, a pre-amplifying circuit, a phase detecting circuit, and an analog/digital converting circuit. The selecting circuit is configured to selectively receive an input of the MR signals output from the receiver coil 6. The pre-amplifying circuit is configured to amplify the MR signals output from the selecting circuit. The phase detecting circuit is configured to detect the phases of the MR signals output from the pre-amplifying circuit. The analog/digital converting circuit is configured to generate the MR signal data by converting analog signals output from the phase detecting circuit into digital signals and to output the generated MR signal data to the processing circuitry 13.

In the present example, the situation in which the transmitter coil 4 applies the RF pulse so that the receiver coil 6 receives the MR signals is explained; however, possible embodiments of the transmitter coil and the receiver coil are not limited to this example. For instance, the transmitter coil 4 may further have a receiving function to receive the MR signals. Further, the receiver coil 6 may further have a transmitting function to apply an RF magnetic field. When the transmitter coil 4 has the receiving function, the receiver circuitry 7 generates MR signal data also from the MR signals received by the transmitter coil 4. Further, when the receiver coil 6 has the transmitting function, the transmitter circuitry 5 outputs an RF pulse also to the receiver coil 6.

The couch 8 includes a couchtop 8a on which the patient S is placed. When an image taking process is performed on the patient S, the couchtop 8a is inserted into the image taking space formed on the inside of the magnetostatic field magnet 1 and the gradient coil 2. For example, the couch 8 is installed in such a manner that the longitudinal direction thereof extends parallel to the central axis of the magnetostatic field magnet 1.

The input circuitry 9 is configured to receive operations to input various types of instructions and various types of information from an operator. More specifically, the input circuitry 9 is connected to the processing circuitry 15 and is configured to convert each of the input operations received from the operator into an electrical signal and to output the electrical signal to the processing circuitry 15. For example, the input circuitry 9 is realized with a trackball, a switch button, a mouse, a keyboard, a touch panel, and/or the like.

The display 10 is configured to display various types of information and various types of images. More specifically, the display 10 is connected to the processing circuitry 15 and is configured to convert data of the various types of information and the various types of images sent thereto from the processing circuitry 15, into display-purpose electrical signals and to output the display-purpose electrical signals. For example, the display 10 is realized with a liquid crystal monitor, a Cathode Ray Tube (CRT) monitor, a touch panel, or the like.

The storage circuitry 11 is configured to store various types of data therein. More specifically, the storage circuitry 11 is configured to store therein the MR signal data and image data for each patient S. For example, the storage circuitry 11 is realized with a semiconductor memory device such as a Random Access Memory (RAM), a flash memory, or the like, or a hard disk, an optical disk, or the like.

The processing circuitry 12 is configured to control operations of the couch 8. For example, the processing circuitry 12 is realized with a processor. For example, the processing circuitry 12 includes a couch controlling function 12a. The couch controlling function 12a is connected to the couch 8 and is configured to control operations of the couch 8 by outputting a control-purpose electrical signal to the couch 8. For example, the couch controlling function 12a receives, via the input circuitry 9, an instruction to move the couchtop 8a in a longitudinal direction, an up-and-down direction, or a left-and-right direction from the operator and operates a driving mechanism for the couchtop 8a included in the couch 8 so as to move the couchtop 8a according to the received instruction.

The processing circuitry 13 is configured to exercise overall control of the MRI apparatus 100, by controlling constituent elements of the MRI apparatus 100. For example, the processing circuitry 13 is realized with a processor. For example, the processing circuitry 13 includes a setting function 13a. The setting function 13a is configured to receive, from the operator, an input of various types of image taking parameters related to a pulse sequence via the input circuitry 9 and to generate sequence execution data on the basis of the received image taking parameters. After that, by transmitting the generated sequence execution data to the processing circuitry 14, the setting function 13a executes various types of pulse sequences.

In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of an RF pulse current to be supplied from the transmitter circuitry 5 to the transmitter coil 4 and the timing with which the RF pulse current is to be supplied; the timing with which the MR signals are to be detected by the receiver circuitry 7, and the like.

The processing circuitry 14 is configured to acquire data of the patient by executing the various types of pulse sequences. For example, the processing circuitry 14 is realized with a processor. For example, the processing circuitry 14 includes an acquiring function 14a. The acquiring function 14a is configured to execute the various types of pulse sequences on the basis of the image taking conditions set by the operator. More specifically, the acquiring function 14a executes various types of pulse sequences by driving the gradient power source 3, the transmitter circuitry 5, and the receiver circuitry 7, on the basis of the sequence execution data output from the processing circuitry 12.

Further, as a result of executing the various types of pulse sequences, the acquiring function 14a receives the MR signal data from the receiver circuitry 7 and stores the received MR signal data into the storage circuitry 11. In this situation, a set made up of the MR signal data received by the acquiring function 14a is stored into the storage circuitry 11 as data structuring a k-space data, by being arranged either two-dimensionally or three-dimensionally in accordance with the position information appended by the read-out gradient magnetic field, the phase-encoding gradient magnetic field, and the slice gradient magnetic field explained above.

The processing circuitry 15 is configured to perform various types of data processing processes such as an image reconstructing process, an image generating process, and the like. For example, the processing circuitry 15 is realized with a processor. For example, the processing circuitry 15 includes a reconstructing function 15a, a calculating function 15b, and a deriving function 15c. The reconstructing function 15a, the calculating function 15b, and the deriving function 15c will be explained in detail later. The processing circuitry 15 is an example of the processing circuitry in the claims.

In this situation, for example, the processing functions included in the processing circuitries 12 to 15 described above are stored in the storage circuitry 11 in the form of computer-executable programs. The processing circuitries realize the processing functions corresponding to the computer programs (hereinafter, "programs") by reading the programs from the storage circuitry 11 and executing the read programs. In other words, the processing circuitries 12 to 15 that have read the programs each have the corresponding one of the processing functions illustrated in FIG. 1.

FIG. 1 illustrates the example in which the processing function included in the processing circuitry 12, the processing function included in the processing circuitry 13, the processing function included in the processing circuitry 14, and the processing function included in the processing circuitry 15 are each realized by a single processing circuit; however, possible embodiments are not limited to this example. For instance, the processing circuitries may be structured by combining a plurality of independent processors together, so that the processing functions are each realized as a result of each of the processors executing a corresponding one of the programs. Further, the processing functions included in the processing circuitries may be realized as being distributed or integrated together into one processing circuit or a plurality of processing circuitries, as appropriate.

An exemplary configuration of the MRI apparatus 100 according to the first embodiment has thus been explained. Generally speaking, MRI apparatuses are apparatuses configured to obtain chemical and physical microscopic information of substances by utilizing the phenomenon where, when a group of targeted nuclear spins is placed in a magnetic field, the nuclear spins resonate with a radio frequency magnetic field that rotates at a specific frequency (a resonant frequency) corresponding to a unique magnetic moment thereof and an existing magnetic field strength, so as to generate signals (magnetic resonance signals) during a relaxation process.

By using an MRI apparatus, it is possible to obtain images having different levels of contrast such as images reflecting T1 values and T2 values that indicate relaxation time of a tissue as well as a proton density, by adjusting the parameters in an image taking pulse sequence; however, normally, a limited number of T1-weighted images and T2-weighted images based on specific parameters that are set in advance are obtained to make a diagnosis, due to time periods required by medical examinations. Nevertheless, it is necessary to use an index having a higher level of objectivity and/or quantitativeness, when pathological progress or an effect of a drug treatment or the like is to be evaluated or when patients are compared with one another.

A method is known by which a T1 map, which is an image of T1 values indicating longitudinal relaxation time of a tissue, is generated by using such an MRI apparatus. To generate the T1 map, a predetermined algorithm is used for performing an acquiring process and a reconstructing process for that purpose, as well as a calculating process to calculate the T1 values by analyzing a reconstructed image. Methods that can be implemented over the processes from the acquiring process through the analyzing process are called T1 mapping methods. For instance, known examples of the T1 mapping methods include an Inversion Recovery (IR) method and a Variable Flip Angle (VFA) method.

Further, in recent years, apparatuses having a higher magnetic field strength such as 3T (Tesla)-MRI apparatuses are also in practical use. Accordingly, T1 mapping methods that are less easily influenced by spatial non-uniformity (hereinafter, "B1 non-uniformity") of Radio Frequency (RF) transmission pulses have been proposed, the spatial non-uniformity being more significant in magnetic fields having higher magnetic field strengths. Known examples of such T1 mapping methods include a Magnetization-Prepared 2 Rapid Acquisition Gradient Echoes (MP2RAGE) method.

Figure 2:
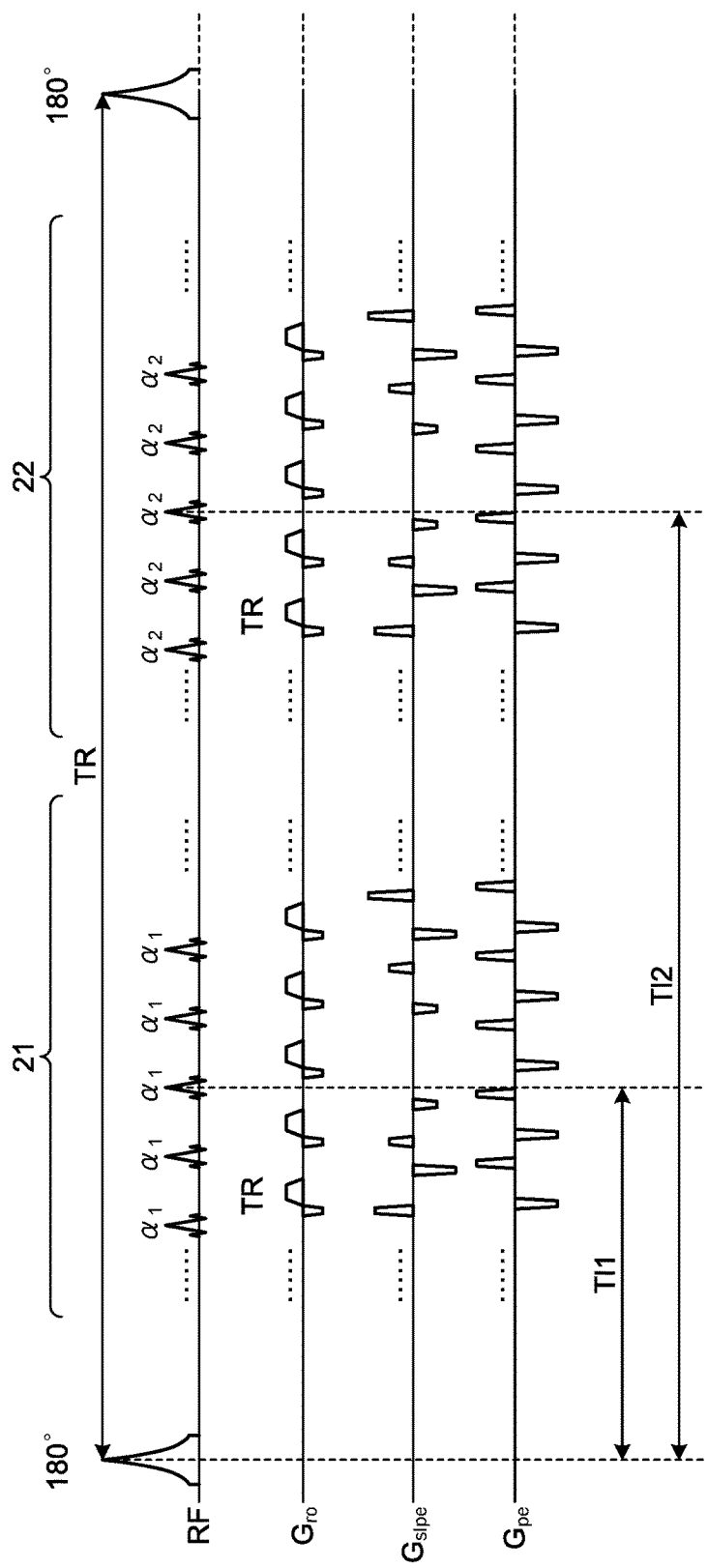
FIG. 2 is a chart illustrating an example of a pulse sequence according to the MP2RAGE method.

FIG. 2 is a chart illustrating an example of a pulse sequence according to the MP2RAGE method. For example, as illustrated in FIG. 2, according to the MP2RAGE method, a first piece of data (hereinafter, first data) 21 and a second piece of data (hereinafter, "second data") 22 are successively acquired by implementing a gradient echo method, after a 180-degree pulse is applied as an Inversion Recovery (IR) pulse. In this situation, the first data 21 and the second data 22 are acquired by using mutually-different Inversion Time (TI) periods (illustrated as TI 1 and TI 2 in FIG. 2). For example, a TI period can be defined as a time period from when the 180-degree pulse is applied to when a corresponding echo occurs at the center of a k-space.

Further, as a method for acquiring the data, for example, a fast gradient echo method may be used. As the IR pulse, a pulse other than the 180-degree pulse may be used. Also, the acquired image may be a 3D image or a 2D image. Furthermore, excitation pulses α1 and α2 may have the same flip angle as each other.

According to the MP2RAGE method, for example, two sets of complex signals are acquired from a three-dimensional region by implementing a fast gradient echo method that uses an IR pulse together, so as to reconstruct two complex images (hereinafter, "GRE1" and "GRE2") from the acquired sets of complex signals. After that, an MP2RAGE image called S_MP2RAGE is generated by performing a calculation in Formula (1) presented below on the two complex images.

$$S\_MP2RAGE = real((GRE1^* \times GRE2)/(|GRE1| \times |GRE1| + |GRE2| \times |GRE2|))) \quad (1)$$

where the symbol "*" denotes a complex conjugate.

In this situation, as described in Marques Jose P., Kober Tobias, Krueger Gunnar, van der Zwaag Wietske, Van de Moortele Pierre-Francois, Gruetter Rolf, "MP2RAGE, a self bias-field corrected sequence for improved segmentation and T-1-mapping at high field", Neuroimage (ISSN:1053-8119), vol. 49, p. 1271-1281, Elsevier 2010 (hereinafter, "Non-Patent Literature 1"), when image taking conditions for implementing the fast gradient echo method are appropriately set, the MP2RAGE image called S_MP2RAGE exhibits characteristics where the signal intensities are dependent on the T1 values and where the influence of the B1 non-uniformity is small.

Figure 3:
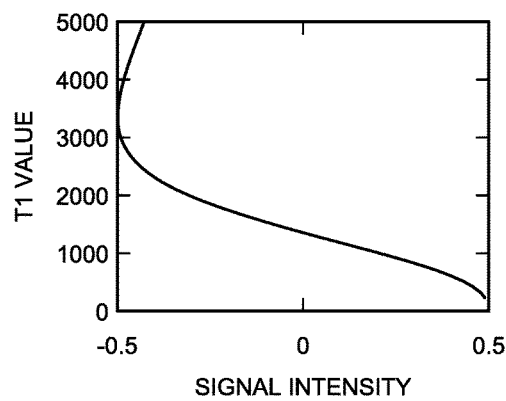
FIG. 3 is a chart illustrating an example of signal intensity characteristics of each pixel in an MP2RAGE image.

FIG. 3 is a chart illustrating an example of signal intensity characteristics of each pixel in an MP2RAGE image. In FIG. 3, the horizontal axis expresses the signal intensity of each pixel in the MP2RAGE image, whereas the vertical axis expresses the T1 value of the tissue. For example, in the range of T1 values approximately from 300 ms to 3,000 ms, it is possible to calculate a T1 value from a MP2RAGE signal, on the basis of the curve illustrated in FIG. 3.

In contrast, when the T1 value is approximately 3,000 ms or larger, the signal intensity of each pixel in the MP2RAGE image is equal to the signal intensity corresponding to another T1 value smaller than approximately 3,000 ms. This characteristic will hereinafter be referred to as "folding of a T1 value". In other words, for example, when a method is adopted by which a T1 value smaller (shorter) than a specific T1 value is selected as a default, the T1 mapping method implementing the MP2RAGE method may be inaccurate when the tissue has a T1 value larger (longer) than the specific T1 value. It should also be noted that the folding of a T1 value may occur even for a short T1, e.g., approximately 300 ms in the curve illustrated in FIG. 3. In other words, for example, when the method is adopted by which a T1 value larger (longer) than a specific T1 value is selected as a default, the T1 mapping method implementing the MP2RAGE method may be inaccurate, also when the tissue has a T1 value smaller (shorter) than the specific T1 value.

To avoid this problem, the acquiring conditions may be changed. For example, as indicated in Non-Patent Literature 1, it is possible to lessen the influence of the B1 non-uniformity by decreasing the flip angle. Accordingly, to make it possible to measure a T1 value of approximately 3,000 ms or larger, although a modification can be made by increasing the flip angle, extending the time intervals to apply the IR pulses, or the like, for example, such a modification would bring about undesirable impacts such as an increase in the influence of the B1 non-uniformity, a longer image taking time period, and the like. Another problem is that it is difficult to set a condition that makes it possible to accurately calculate smaller (shorter) T1 values and larger (longer) T1 values at the same time.

To cope with these problems, when measuring the T1 values of a tissue of an examined patient, the MRI apparatus 100 according to the first embodiment provides a method for accurately analyze a range of T1 values from a smaller (shorter) level to a larger (longer) level by avoiding the folding of T1 values without the need to change the image taking conditions, by acquiring data with the MP2RAGE method and using both an MP2RAGE image and a ratio image.

More specifically, according to the first embodiment, the setting function 13a included in the processing circuitry 13 receives, from an operator, an image taking parameter used for acquiring the data by implementing the MP2RAGE method. Further, the setting function 13a generates sequence execution data used for executing a pulse sequence of the MP2RAGE method on the basis of the received image taking parameter and causes the acquiring function 14a to execute the pulse sequence of the MP2RAGE method by transmitting the generated sequence execution data to the processing circuitry 14.

Further, the calculating function 15b included in the processing circuitry 15 calculates, in units of pixels, complex product signal values each indicating a signal value of a complex product and a complex ratio signal value indicating a signal value of a complex ratio, by using first data and second data acquired by using mutually-different TI periods while implementing the MP2RAGE method. In this situation, the calculating function 15b calculates the complex product signal values by dividing a value obtained by multiplying the signal value of first data 41 by the signal value of second data 42, by a value obtained by adding the squared signal value of the first data 41 to the squared signal value of the second data 42. Further, the calculating function 15b calculates the complex ratio signal value by dividing the signal value of the first data 41 by the signal value of the second data 42. After that, the deriving function 15c included in the processing circuitry 15 derives the T1 value of the pixel from one of the complex product signal values selected on the basis of the complex ratio signal value calculated by the calculating function 15b.

In the first embodiment, the complex product signal values are each a signal value of the MP2RAGE image obtained from the first data and the second data acquired by implementing the MP2RAGE method. Further, in the first embodiment, the complex ratio signal value is the signal value of the ratio image obtained from the first data and the second data acquired by implementing the MP2RAGE method.

Figure 4:
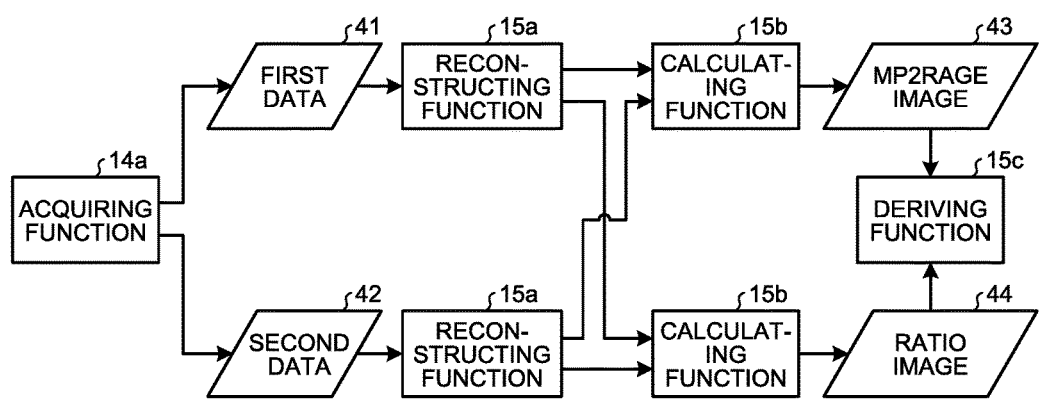
FIG. 4 is a drawing for explaining details of an acquiring function, a reconstructing function, a calculating function, and a deriving function according to the first embodiment.

FIG. 4 is a drawing for explaining details of the acquiring function, the reconstructing function, the calculating function, and the deriving function according to the first embodiment. For example, as illustrated in FIG. 4, in the first embodiment, the acquiring function 14a acquires the first data 41 and the second data 42 represented by two sets of MP2RAGE signals corresponding to the mutually-different T1 periods, by executing the pulse sequence of the MP2RAGE method.

Further, the reconstructing function 15a generates two MP2RAGE original images by applying a process such as a Fast Fourier Transform (FFT) or the like to the first data 41 and the second data 42. After that, the reconstructing function 15a inputs the two generated MP2RAGE original images to the calculating function 15b.

Further, by using the two MP2RAGE original images input thereto from the reconstructing function 15a, the calculating function 15b generates an MP2RAGE image 43. In this situation, by performing the calculation while using Formula (1) above, the calculating function 15b generates the MP2RAGE image called S_MP2RAGE.

Further, by using the two MP2RAGE original images input thereto from the reconstructing function 15a, the calculating function 15b generates a ratio image 44. In this situation, by performing a calculation in Formula (2) presented below, the calculating function 15b generates a ratio image called S_Ratio.

$$S\_Ratio = real(GRE1/GRE2) \quad (2)$$

More specifically, the calculating function 15b generates the MP2RAGE image called S_MP2RAGE by using Formula (3) presented below and further generates the ratio image called S_Ratio by using Formula (4) presented below, where $GRE1 = R1 + iX1$ and $GRE2 = R2 + iX2$.

$$S\_MP2RAGE = (R1 \times R2 + X1 \times X2)/(R1^2 + X1^2 + R2^2 + X2^2) \quad (3)$$

$$S\_Ratio = (R1 \times R2 + X1 \times X2)/(R2^2 + X2^2) \quad (4)$$

In this situation, the calculating function 15b re-reconstructs a real image and an imaginary image from the complex image GRE1 obtained from the first data 41, and also, re-reconstructs a real image and an imaginary image from the complex image GRE2 obtained from the second data 42. After that, the calculating function 15b generates the MP2RAGE image called S_MP2RAGE, by assigning the real image and the imaginary image obtained from GRE1 to R1 and X1 in Formula (3), respectively, and assigning the real image and the imaginary image obtained from GRE2 to R2 and X2 in Formula (3), respectively. Further, the calculating function 15b generates the ratio image called S_Ratio by assigning the real image and the imaginary image obtained from GRE1 to R1 and X1 in Formula (4), respectively, and assigning the real image and the imaginary image obtained from GRE2 to R2 and X2 in Formula (4), respectively.

Figure 5:
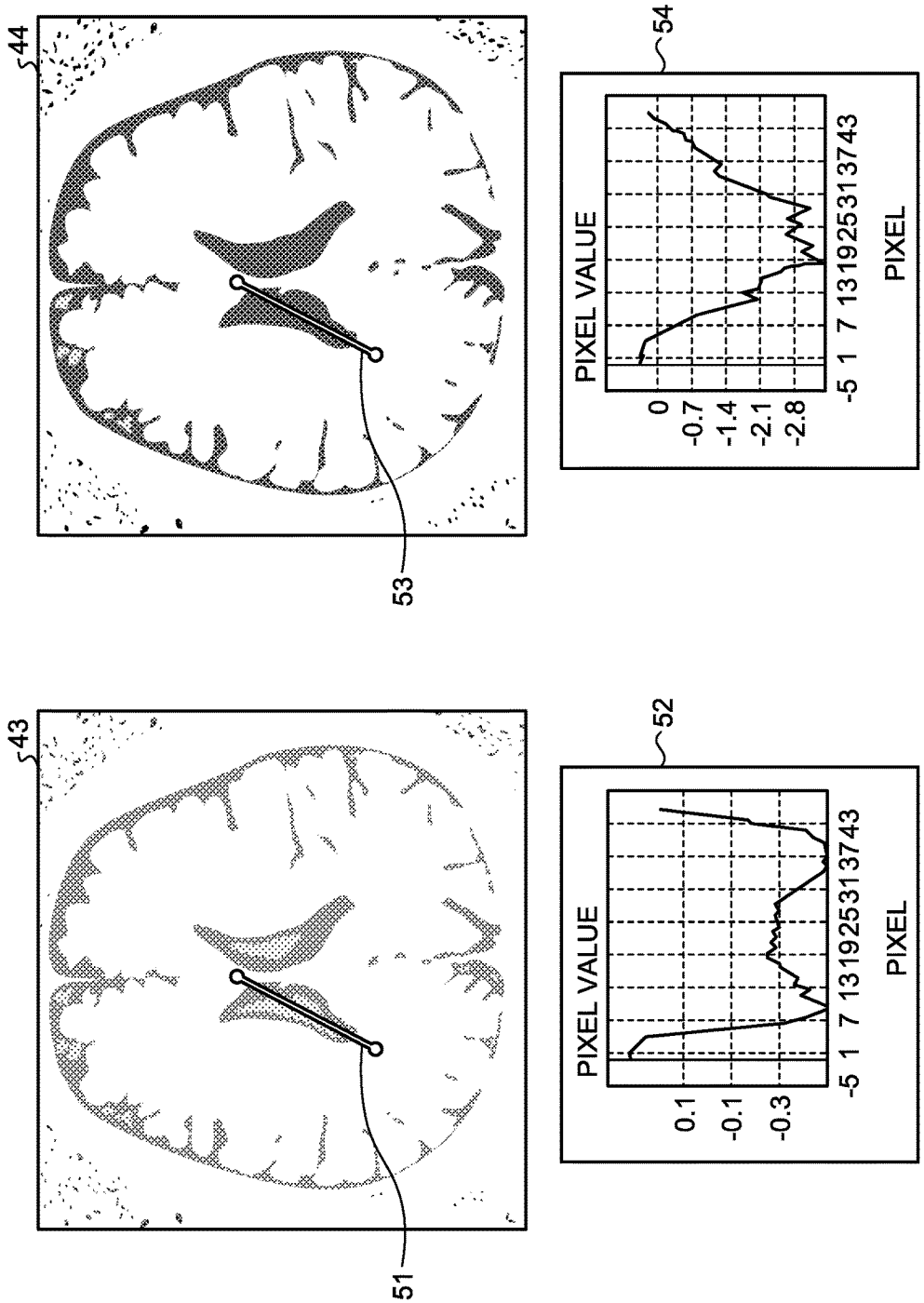
FIG. 5 is a drawing illustrating examples of an MP2RAGE image and a ratio image generated by the calculating function according to the first embodiment.

FIG. 5 is a drawing illustrating examples of the MP2RAGE image and the ratio image generated by the calculating function according to the first embodiment. FIG. 5 illustrates an MP2RAGE image 43 and a ratio image 44 of the head of a person, a profile 52 of pixel values on a straight line 51 passing through the lateral ventricle illustrated in the MP2RAGE image 43, and a profile 54 of pixel values on a straight line 53 passing through the lateral ventricle illustrated in the ratio image 44. For example, as indicated by the profile 52, in the MP2RAGE image 43, the folding of T1 values occurs in the part rendering the Cerebrospinal Fluid (CSF) within the lateral ventricle. In contrast, for example, as indicated by the profile 54, in the ratio image 44, no folding occurs in the lateral ventricle, and a correct distribution of the CSF is rendered.

Further, the calculating function 15b inputs the MP2RAGE image 43 and the ratio image 44 that were generated, to the deriving function 15c.

After that, the deriving function 15c selects a T1 value from among a plurality of T1 value candidates corresponding to predetermined complex product signal values, on the basis of the calculated complex ratio signal value. In this situation, the deriving function 15c selects the T1 value from among the plurality of candidates, on the basis of a relationship between complex product signal values and T1 values and a relationship between complex ratio signal values and T1 values obtained from the image taking parameters used when the first data and the second data were acquired.

In the first embodiment, the deriving function 15c generates a T1 map by calculating a T1 value for each of the pixels, by using the MP2RAGE image 43 and the ratio image 44 input thereto from the calculating function 15b.

Figure 6:
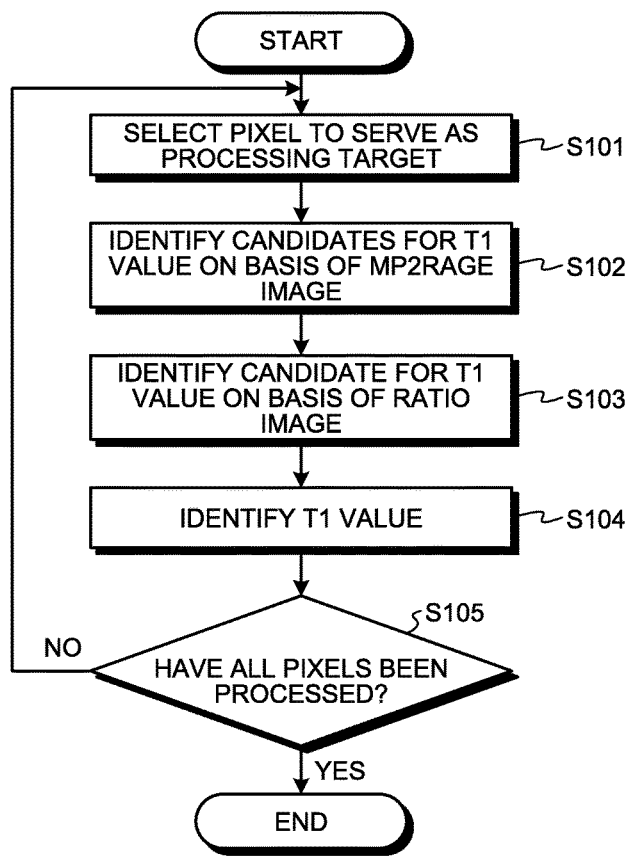
FIG. 6 is a flowchart illustrating a processing procedure performed by the deriving function according to the first embodiment.

FIG. 6 is a flowchart illustrating a processing procedure performed by the deriving function according to the first embodiment. The steps explained below are realized, for example, as a result of the processing circuitry 15 invoking and executing a predetermined program corresponding to the deriving function 15c from the storage circuitry 11.

For example, as illustrated in FIG. 6, the deriving function 15c first selects a pixel that serves as a processing target (step S101). Subsequently, the deriving function 15c identifies candidates for the T1 value, on the basis of the pixel value of the MP2RAGE image in the position of the pixel selected as the processing target (step S102).

In the first embodiment, on the basis of image taking parameters received from the operator, the setting function 13a included in the processing circuitry 13 calculates, in advance, the relationship between the complex product signal values and the T1 values and the relationship between the complex ratio signal values and the T1 values. After that, on the basis of the calculated relationships, the setting function 13a generates a conversion table used for converting values between the complex product signal values and the T1 values and a conversion table used for converting values between the complex ratio signal values and the T1 values and further stores the generated conversion tables into the storage circuitry 11. Alternatively, the setting function 13a may generate mathematical functions each expressing a different one of the relationships and may store the generated mathematical functions into the storage circuitry 11.

Figure 7:
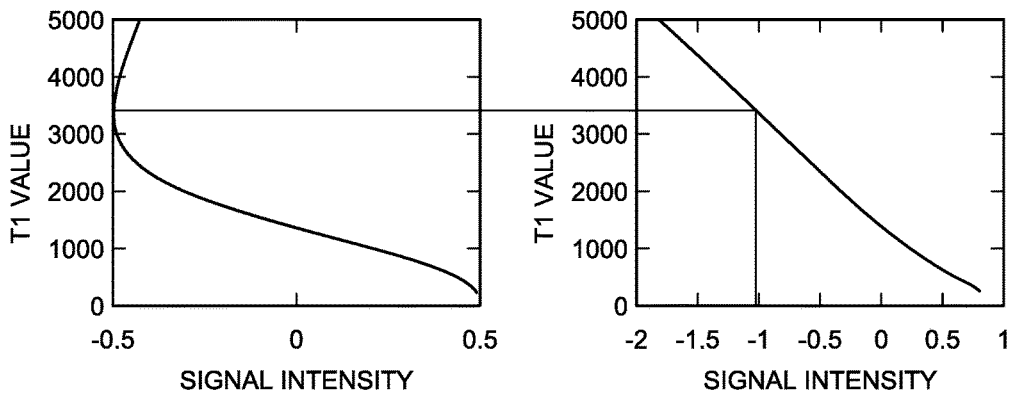
FIG. 7 presents charts illustrating examples of conversion tables generated by a setting function according to the first embodiment.

FIG. 7 presents charts illustrating examples of the conversion tables generated by the setting function according to the first embodiment. FIG. 7 illustrates, in the charts, the values brought into correspondence with each other by the conversion tables. The chart on the left side of FIG. 7 illustrates the correspondence between signal intensities and T1 values of each pixel in the MP2RAGE image. The chart on the right side of FIG. 7 illustrates the correspondence between signal intensities and T1 values of each pixel in the ratio image.

For example, by using a formula presented in Non-Patent Literature 1 and Formula (1) presented above, the setting function 13a calculates the relationship between the signal intensities and the T1 values of each pixel in the MP2RAGE image, on the basis of the image taking parameters (e.g., a Repetition Time (TR) value, a flip angle $\alpha$, and the like) set by the operator. Further, by using the formula presented in Non-Patent Literature 1 and Formula (2) presented above, the setting function 13a calculates the relationship between the signal intensities and the T1 values of each pixel in the ratio image, on the basis of the image taking parameters set by the operator.

After that, the deriving function 15c identifies candidates for the T1 value (candidates for the T1 value solution) corresponding to the pixel value of the MP2RAGE image in the position of the pixel selected as a processing target, by referring to the conversion table indicating the correspondence between the signal intensities and the T1 values of each pixel and in the MP2RAGE image (or by using the mathematical function). In that situation, for example, as indicated in the drawing on the left side of FIG. 7, according to the relationship between the signal intensities and the T1 values of each pixel in the MP2RAGE image, two or more T1 value candidates may be present with respect to one signal intensity (for example, in the range of signal intensities from −0.5 to approximately −0.45).

Subsequently, the deriving function 15c identifies a candidate for the T1 value (a candidate for the T1 value solution) corresponding to the pixel value of the ratio image in the position of the pixel selected as the processing target, by referring to the conversion tables generated by the setting function 13a (or by using the mathematical function), (step S103). In this situation, for example, as illustrated in the chart on the right side of FIG. 7, according to the relationship between the signal intensities and the T1 values of each pixel in the ratio image, one T1 value candidate is identified with respect to one signal intensity.

Further, by comparing the T1 candidates from the two identifying processes with each other, the deriving function 15c identifies one T1 value (a correct T1 value solution) (step S104). More specifically, the deriving function 15c selects a T1 value closer to the T1 value identified on the basis of the pixel value in the ratio image, from among the T1 value candidates identified on the basis of the pixel value in the MP2RAGE image.

By performing the process described above on all the pixels one by one, the deriving function 15c derives a T1 value of each of the pixels (step S105). Accordingly, the deriving function 15c generates the T1 map. After that, for example, the deriving function 15c stores the generated T1 map into the storage circuitry 11 and/or outputs the generated T1 map to the display 10.

Figure 8:
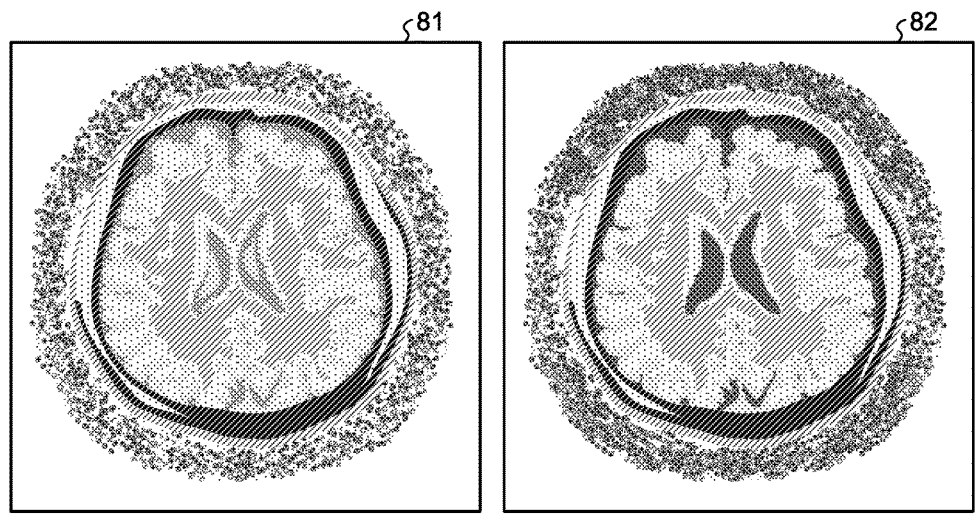
FIG. 8 is a drawing illustrating examples of T1 maps generated by the deriving function according to the first embodiment.

FIG. 8 is a drawing illustrating examples of T1 maps generated by the deriving function according to the first embodiment. For example, as illustrated in FIG. 8, the deriving function 15c generates a T1 map in which, for each of the pixels, the brightness value is varied according to the T1 value thereof. Illustrated on the left side of FIG. 8 is a T1 map 81 obtained by directly calculating T1 values from the MP2RAGE image, without making the corrections on the basis of the ratio image. In contrast, illustrated on the right side of FIG. 8 is a T1 map 82 obtained by making the corrections on the basis of the ratio image, as described above. For example, as illustrated in FIG. 8, in the T1 map 81 without the corrections, the brightness values in the lateral ventricle are inverted due to the folding of the T1 values. In contrast, in the T1 map 82 obtained with the corrections, it is observed that the brightness values in the lateral ventricle are not inverted, and the T1 values are expressed more appropriately.

As explained above, according to the first embodiment, it is possible to realize the T1 mapping method having a higher level of precision.

In the first embodiment described above, the example is explained in which the deriving function 15c selects the T1 value, on the basis of the relationship between the signal intensities and the T1 values of each pixel in the MP2RAGE image and the relationship between the signal intensities and the T1 values of each pixel in the ratio image; however, possible embodiments are not limited to this example. For instance, the deriving function 15c may select the T1 value by using only the relationship between the signal intensities and the T1 values of each pixel in the ratio image.

In that situation, the calculating function 15b calculates, in units of pixels, a complex ratio signal value indicating the signal value of the complex ratio, by using the first data and the second data successively acquired by implementing the gradient echo method after the IR pulse is applied. Further, on the basis of the complex ratio signal value calculated by the calculating function 15b, the deriving function 15c derives a T1 value of each of the pixels. In other words, in this situation, the calculating function 15b does not necessarily have to calculate the signal values of the MP2RAGE image. The deriving function 15c derives the T1 values by referring to the conversion table on the basis of the signal values of the ratio image.

As explained above, it is possible to derive the T1 values only from the signal values of the ratio image; however, it is considered that deriving the T1 values on the basis of the signal values of the MP2RAGE image as explained above is able to achieve a more advantageous result. The reason is that the MP2RAGE image is more advantageous than the ratio image in terms of noise propagations, as described in Non-Patent Literature 1. Accordingly, it is possible to have the accurate T1 values confirmed, by matching the T1 value candidate from the ratio image with the T1 value candidates (of which there may be two or more, depending on the situation) that are less easily affected by noise and are selected in a stable manner on the basis of the MP2RAGE image.

Second Embodiment

In the first embodiment above, the example is explained in which the deriving function uses the ratio image as an input thereto; however, possible embodiments are not limited to this example. For instance, the deriving function may use a mask image generated from a ratio image as an input thereto. In the present example, the mask image is image data of which pixel values are mask values each indicating whether the folding of a T1 value is present or not.

In the following sections, an example of such a situation will be explained as a second embodiment. In the second embodiment, some of the configurations of the MRI apparatus 100 that are different from those in the first embodiment will primarily be explained. Other constituent elements that have the same roles as those of the constituent elements illustrated in FIG. 1 will be referred to by using the same reference characters, and detailed explanations thereof will be omitted.

Figure 9:
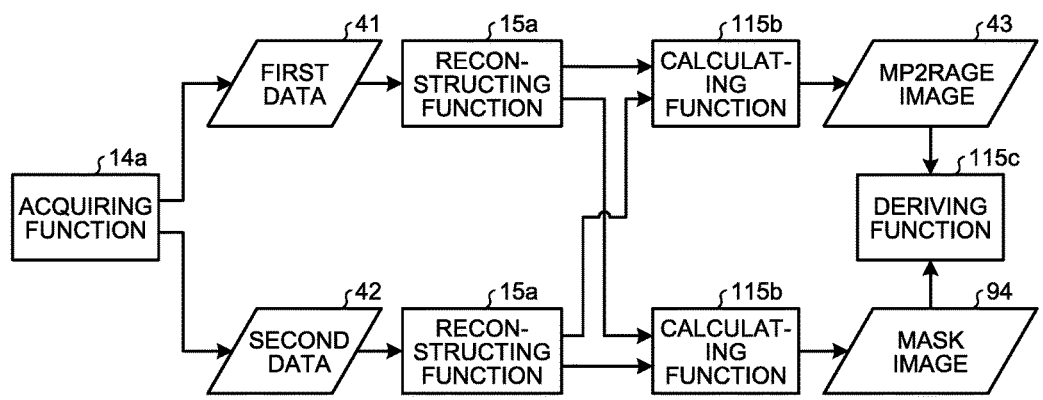
FIG. 9 is a diagram for explaining details of an acquiring function, a reconstructing function, a calculating function, and a deriving function according to a second embodiment.

FIG. 9 is a diagram for explaining details of an acquiring function, a reconstructing function, a calculating function, and a deriving function according to the second embodiment. For example, as illustrated in FIG. 9, in the second embodiment, a calculating function 115b inputs a mask image 94 to a deriving function 115c, in place of the ratio image 44 illustrated in FIG. 4.

More specifically, the calculating function 115b identifies a T1 value at the boundary where the folding of the T1 value occurs, on the basis of the relationship between complex product signal values and T1 values, and further identifies a reference complex ratio signal value indicating the complex ratio signal value corresponding to the T1 value at the boundary, on the basis of the relationship between the complex ratio signal values and the T1 values. After that, the calculating function 115b generates the mask image 94 in which pixel values are set so as to each indicate whether the folding of the T1 value has occurred or not, depending on whether the calculated complex ratio signal value is larger or smaller than the reference complex ratio signal value.

Figure 10:
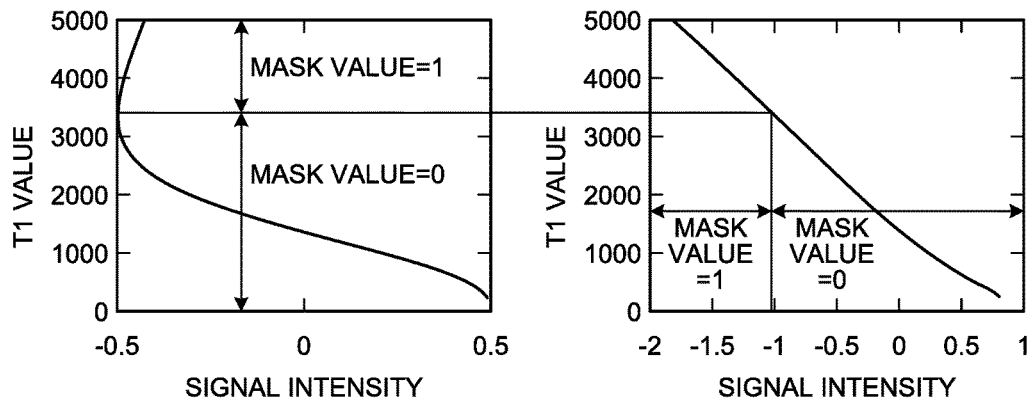
FIG. 10 presents charts for explaining a mask image generating process performed by the calculating function according to the second embodiment.

FIG. 10 presents charts for explaining the mask image generating process performed by the calculating function according to the second embodiment. Similarly to FIG. 7, FIG. 10 illustrates, in the charts, the values brought into correspondence with each other by the conversion tables. The chart on the left side of FIG. 10 illustrates the correspondence between the signal intensities and the T1 values of each pixel in the MP2RAGE image. The chart on the right side of FIG. 10 illustrates the correspondence between the signal intensities and the T1 values of each pixel in the ratio image.

For example, the calculating function 115b identifies a T1 value at which folding occurs (approximately 3,000 ms in the example in FIG. 10) by referring to the conversion table indicating the correspondence between the signal intensities and the T1 values of each pixel in the MP2RAGE image as illustrated by the chart on the left side of FIG. 10. After that, for example, the calculating function 115b defines the mask value=0 for the region having T1 values smaller than the identified T1 value and defines the mask value=1 for the region having T1 values equal to or larger than the T1 value at which the folding occurs. In other words, the mask value=0 indicates that no folding of the T1 value has occurred. On the contrary, the mask value=1 indicates that folding of the T1 value has occurred.

After that, the calculating function 115b identifies the signal intensity of each pixel in the ratio image corresponding to the identified T1 value as a reference signal intensity (approximately −1 in the example in FIG. 10), by referring to the conversion table indicating the correspondence between the signal intensities and the T1 values of each pixel in the ratio image as illustrated in the chart on the right side of FIG. 10. Subsequently, for the ratio image 44 generated in the same manner as in the first embodiment, the calculating function 115b sets the mask value=0 for the pixels each having a signal intensity higher than the reference signal intensity and sets the mask value=1 for the pixels each having a signal intensity equal to or lower than the reference signal intensity. In this manner, the calculating function 115b generates the mask image 94 by replacing the pixel value of each of the pixels included in the ratio image 44 with the mask value.

Figure 11:
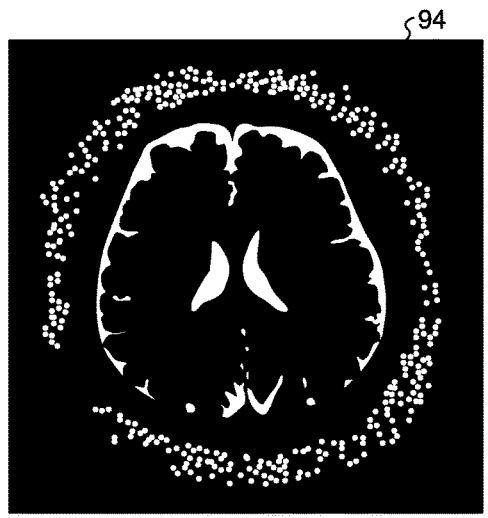
FIG. 11 is a drawing illustrating an example of a mask image generated by the calculating function according to the second embodiment.

FIG. 11 is a drawing illustrating an example of a mask image generated by the calculating function according to the second embodiment. For example, as illustrated in FIG. 11, the calculating function 115b generates the mask image 94 in which the value "1" is set (the pixels in the white part in FIG. 11) for each of the pixels where folding of the T1 value has occurred and the value "0" is set (the pixels in the black part in FIG. 11) for each of the pixels where no folding of the T1 value has occurred.

Further, in the second embodiment, the deriving function 115c selects a T1 value from among the plurality of candidates, depending on whether the calculated complex ratio signal value is larger or smaller than the reference complex ratio signal value. In this situation, the deriving function 115c selects the T1 value from among the plurality of candidates, by judging, on the basis of the mask image 94, whether each of the calculated complex ratio signal values is larger or smaller than the reference complex ratio signal value.

Figure 12:
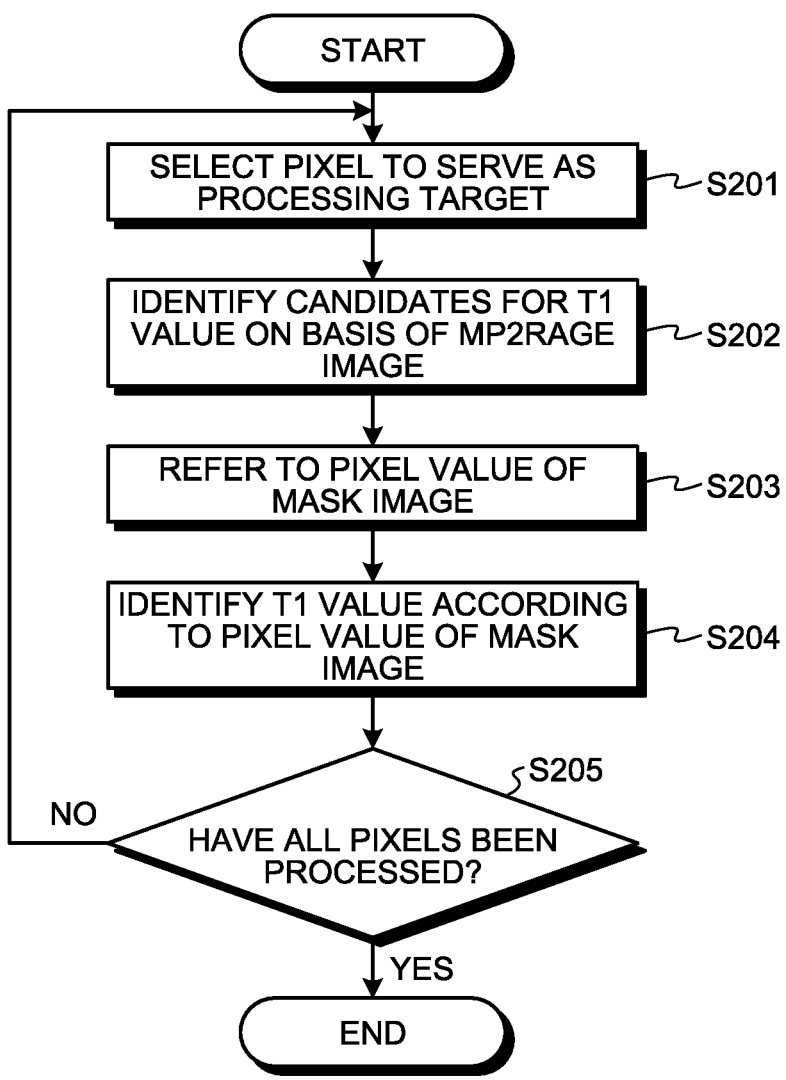
FIG. 12 is a flowchart illustrating a processing procedure performed by the deriving function according to the second embodiment.

FIG. 12 is a flowchart illustrating a processing procedure performed by the deriving function 115c according to the second embodiment. The steps described below are realized as a result of, for example, the processing circuitry 15 invoking and executing a predetermined program corresponding to the deriving function 115c from the storage circuitry 11.

For example, as illustrated in FIG. 12, the deriving function 115c first selects a pixel that serves as a processing target (step S201). Subsequently, the deriving function 115c identifies candidates for the T1 value, on the basis of the pixel value of the MP2RAGE image in the position of the pixel selected as the processing target (step S202).

Further, the deriving function 115c refers to the pixel value of the mask image 94 in the position of the pixel selected as the processing target (step S203). Further, in accordance with the pixel value of the mask image 94, the deriving function 115c identifies the value of the T1 value (step S204).

More specifically, when the pixel value of the mask image 94 is "1", the deriving function 115c identifies candidates for the T1 value corresponding to the pixel value of the MP2RAGE image 43 in the position of the pixel serving as the processing target, by referring to the conversion table indicating the correspondence between the signal intensities and the T1 values of each pixel in the MP2RAGE image. When the pixel value of the mask image 94 is "1", because it means that the folding of the T1 value has occurred, the deriving function 115c selects the larger T1 value from among the plurality of candidates for the T1 value in that situation.

On the contrary, when the pixel value of the mask image 94 is "0", the deriving function 115c identifies candidates for the T1 value corresponding to the pixel value of the MP2RAGE image 43 in the position of the pixel serving as the processing target, by referring to the conversion table indicating the correspondence between the signal intensities and the T1 values of each pixel in the MP2RAGE image.

When the pixel value of the mask image 94 is "0", because it means that no folding of the T1 value has occurred, the deriving function 115c selects the smaller T1 value from among the plurality of candidates for the T1 value in that situation.

For example, when there is an upper limit value (5,000 ms in the example in FIG. 10) for the T1 value as illustrated on the left side of FIG. 10, when the mask value is "0", there may be two or more candidates for the T1 value (in the range of signal intensities from −0.5 to approximately −0.45 in the example in FIG. 10) or there may be only one candidate for the T1 value (in the range of signal intensities from approximately −0.45 to 0.5 in the example in FIG. 10). Accordingly, when the pixel value of the mask image 94 is "0" and if one T1 value is identified as the candidate for T1 value, the deriving function 115c uses the identified T1 value without any further process applied thereto. In other words, in that situation, as the T1 value corresponding to the pixel value of the MP2RAGE image 43 in the position of the pixel serving as the processing target, the deriving function 115c directly identifies the single T1 value, instead of selecting a T1 value from among the plurality of candidates.

As explained above, by inputting the mask image 94 and the MP2RAGE image 43 to the deriving function 115c, it is possible to uniquely determine the T1 value.

By performing the process described above on all the pixels one by one, the deriving function 115c derives a T1 value of each of the pixels (step S205). Accordingly, the deriving function 115c generates the T1 map. After that, for example, the deriving function 115c stores the generated T1 map into the storage circuitry 11 and/or outputs the generated T1 map to the display 10.

Figure 13:
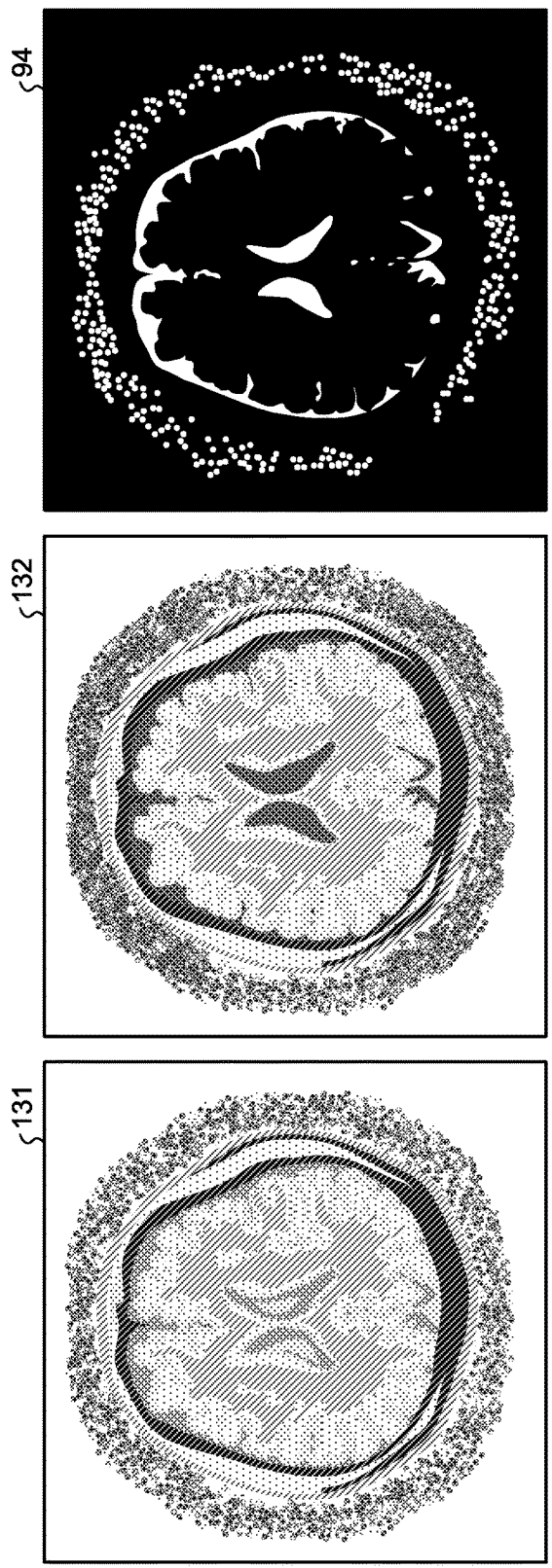
FIG. 13 is a drawing illustrating examples of T1 maps generated by the deriving function according to the second embodiment.

FIG. 13 is a drawing illustrating examples of T1 maps generated by the deriving function according to the second embodiment. For example, as illustrated in FIG. 13, the deriving function 115c generates a T1 map in which, for each of the pixels, the brightness value is varied according to the T1 value thereof. Illustrated on the left side of FIG. 13 is a T1 map 131 obtained by directly calculating T1 values from the MP2RAGE image, without making the corrections on the basis of the ratio image. Further, illustrated in the middle section of FIG. 13 is a T1 map 132 obtained by making the corrections on the basis of the mask image 94, as described above. Further, illustrated on the right side of FIG. 13 is the mask image 94. For example, as illustrated in FIG. 13, in the T1 map 131 without the corrections, the brightness values in the lateral ventricle are inverted due to the folding of the T1 values. In contrast, in the T1 map 132 obtained with the corrections, it is observed that the brightness values in the lateral ventricle are not inverted, and the T1 values are expressed more appropriately.

According to the second embodiment described above, it is possible to realize the T1 mapping method having a higher level of precision, similarly to the first embodiment.

Further, according to the second embodiment, by inputting the mask image 94 to the deriving function 115c in place of the ratio image 44, it is possible to reduce the size of the image data provided for the deriving function 115c, and it is therefore possible to reduce the processing load on the deriving function 115c. Further, by handling the mask image 94 as additional information to the MP2RAGE image 43, it is also possible to achieve an advantageous effect where cumbersomeness during the operation is reduced, and the like.

Third Embodiment

In the first and the second embodiments described above, embodiments of the MRI apparatus are explained; however, possible embodiments of the image processing methods of the present disclosure are not limited to these examples. For instance, the image processing method described above may be implemented by an image processing apparatus connected to the MRI apparatus 100 via a network. In the following sections, embodiments of such an image processing apparatus will be explained as a third embodiment.

Figure 14:
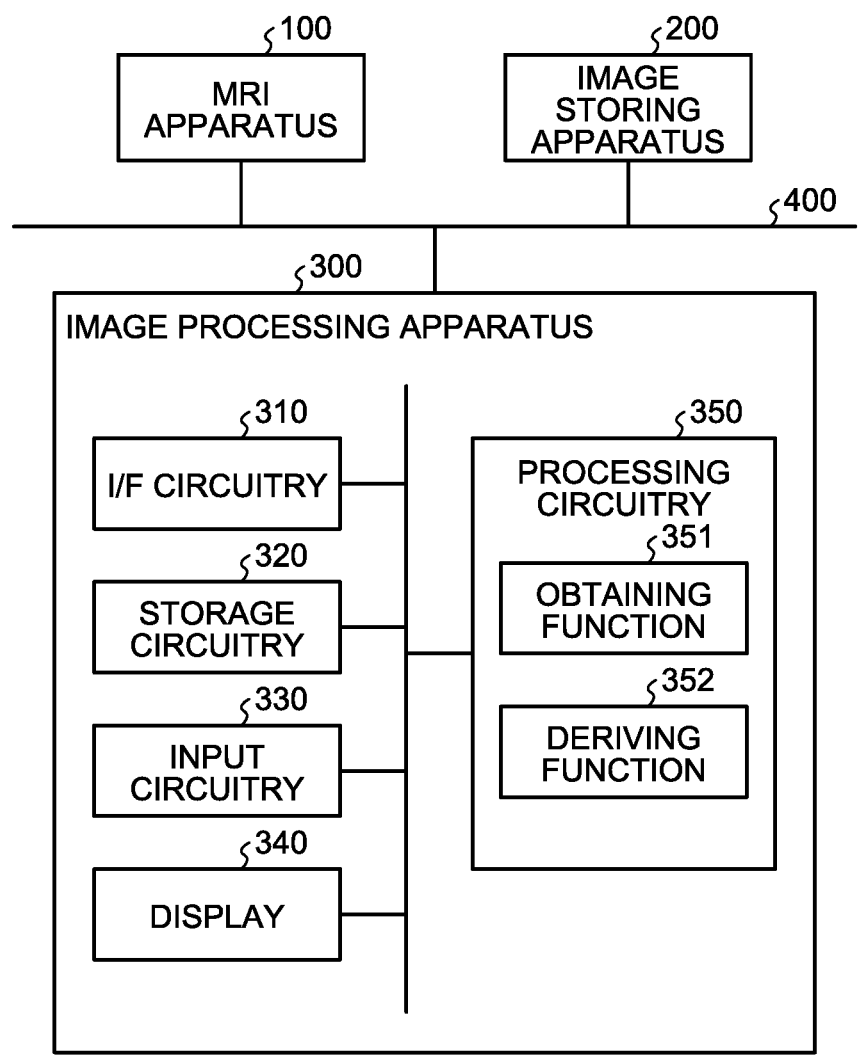
FIG. 14 is a diagram of an exemplary configuration of an image processing apparatus according to a third embodiment.

FIG. 14 is a diagram of an exemplary configuration of an image processing apparatus according to the third embodiment. For example, as illustrated in FIG. 14, an image processing apparatus 300 according to the third embodiment is connected to the MRI apparatus 100 and an image storing apparatus 200 via a network 400. The image processing apparatus 300 may further be connected, via the network 400, to another image diagnosis apparatus such as an X-ray Computed Tomography (CT) apparatus, an ultrasound diagnosis apparatus, a Positron Emission Tomography (PET) apparatus, or the like.

The MRI apparatus 100 is configured to acquire image data of the patient by utilizing the magnetic resonance phenomenon. More specifically, the MRI apparatus 100 acquires magnetic resonance data from the patient by executing various types of image taking sequences on the basis of image taking conditions set by the operator. Further, by performing an image processing process such as a Fourier transform process or the like on the acquired magnetic resonance data, the MRI apparatus 100 generates two-dimensional or three-dimensional image data.

The image storing apparatus 200 is configured to store therein image data acquired by any of the various types of image diagnosis apparatuses. More specifically, the image storing apparatus 200 obtains the image data from the MRI apparatus 100 via the network 400 and stores the obtained image data into a storage circuitry provided on either the inside or the outside of the apparatus. For example, the image storing apparatus 200 may be realized with a computer device such as a server apparatus.

The image processing apparatus 300 is configured to process image data acquired by any of the various types of image diagnosis apparatuses. More specifically, the image processing apparatus 300 obtains the image data from either the MRI apparatus 100 or the image storing apparatus 200 via the network 400 and stores the obtained image data into a storage circuitry provided on either the inside or the outside of the apparatus. Further, the image processing apparatus 300 performs various types of image processing processes on the obtained image data and causes a display device or the like to display the image data either before the image processing processes or after the image processing processes. For example, the image processing apparatus 300 may be realized with a computer device such as a workstation.

For example, as illustrated in FIG. 14, the image processing apparatus 300 includes interface (I/F) circuitry 310, storage circuitry 320, input circuitry 330, a display 340, and processing circuitry 350.

The I/F circuitry 310 is configured to control the transfer and communication of various types of data transmitted and received between the image processing apparatus 300 and another apparatus connected via the network 400. More specifically, the I/F circuitry 310 is connected to the processing circuitry 350, converts the image data output from the processing circuitry 350 into image data in a format compliant with a predetermined communication protocol, and transmits the converted image data to either the MRI apparatus 100 or the image storing apparatus 200. Further, the I/F circuitry 310 outputs the image data received from the MRI apparatus 100 or the image storing apparatus 200 to the processing circuitry 350. For example, the I/F circuitry 310 may be realized with a network card, a network adaptor, a Network Interface Controller (NIC), or the like.

The storage circuitry 320 is configured to store therein various types of data. More specifically, the storage circuitry 320 is connected to the processing circuitry 350 and either stores the input image data therein or outputs the stored image data to the processing circuitry 350, in accordance with an instruction sent thereto from the processing circuitry 350. For example, the storage circuitry 320 may be realized with a semiconductor memory device such as a Random Access Memory (RAM), a flash memory, or the like, or a hard disk, an optical disk, or the like.

The input circuitry 330 is configured to receive input operations of various types of instructions and various types of information from the operator. More specifically, the input circuitry 330 is connected to the processing circuitry 350, converts the input operations received from the operator into electrical signals, and outputs the electrical signals to the processing circuitry 350. For example, the input circuitry 330 may be realized with a trackball, a switch button, a mouse, a keyboard, a touch panel, and/or the like.

The display 340 is configured to display various types of information and various types of images. More specifically, the display 340 is connected to the processing circuitry 350 and displays the images in various types of formats, on the basis of the image data output from the processing circuitry 350. For example, the display 340 may be realized with a liquid crystal monitor, a Cathode Ray Tube (CRT) monitor, a touch panel, or the like.

The processing circuitry 350 is configured to control constituent elements of the image processing apparatus 300 in accordance with the input operations received from the operator via the input circuitry 330. More specifically, the processing circuitry 350 stores the image data output from the I/F circuitry 310 into the storage circuitry 320. Further, the processing circuitry 350 causes the display 340 to display the image data read from the storage circuitry 320. For example, the processing circuitry 350 may be realized with a processor.

In this situation, for example, the processing functions of the processing circuitry 350 described above are stored in the storage circuitry 320 in the form of computer-executable programs. The processing circuitry 350 realizes the processing functions corresponding to the programs by reading the programs from the storage circuitry 320 and executing the read programs. In other words, the processing circuitry 350 that has read the programs has the processing functions illustrated in FIG. 14.

Although FIG. 14 illustrates the example in which the single processing circuitry 350 realizes the processing functions of the processing circuitry 350, possible embodiments are not limited to this example. For instance, the processing circuitry 350 may be structured by combining a plurality of independent processors together, so that the processing functions are each realized as a result of each of the processors executing a corresponding one of the programs. Further, the processing functions of the processing circuitry 350 may be realized as being distributed or integrated together into one processing circuit or a plurality of processing circuitries, as appropriate.

In the third embodiment configured as described above, the processing circuitry 350 included in the image processing apparatus 300 includes an obtaining function 351 and a deriving function 352. The processing circuitry 350 is an example of the processing circuitry in the claims.

The obtaining function 351 is configured to obtain complex product signal values each indicating a signal value of a complex product and a complex ratio signal value indicating a signal value of a complex ratio calculated in units of pixels by using first data and second data successively acquired by implementing a gradient echo method after an IR pulse is applied. Further, the deriving function 352 is configured to derive a T1 value of each of the pixels from one of the complex product signal values selected on the basis of the obtained complex ratio signal value.

For example, when the MRI apparatus 100 has the functions explained in the first embodiment, the obtaining function 351 obtains the MP2RAGE image 43 and the ratio image 44 from the MRI apparatus 100.

Figure 15:
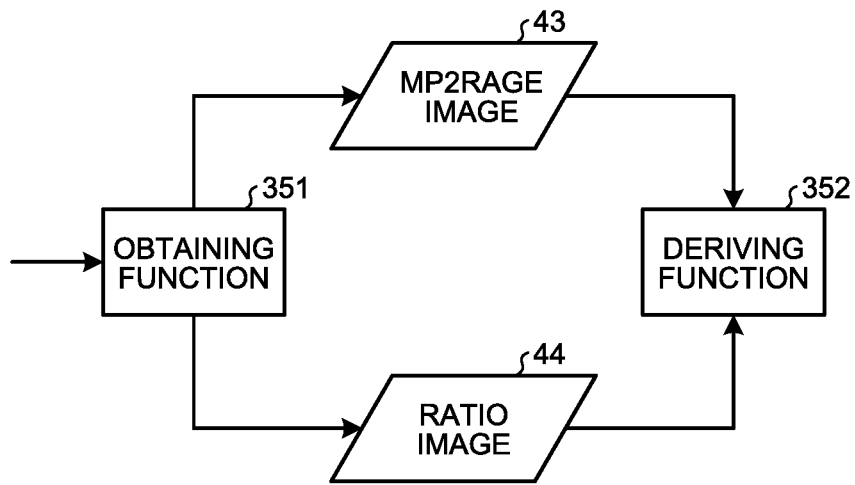
FIG. 15 is a diagram for explaining details of an obtaining function and a deriving function according to the third embodiment.

FIG. 15 is a diagram for explaining details of the obtaining function and the deriving function according to the third embodiment. For example, as illustrated in FIG. 15, the obtaining function 351 obtains the MP2RAGE image 43 and the ratio image 44 from the MRI apparatus 100.

In this situation, together with the MP2RAGE image 43 and the ratio image 44, the obtaining function 351 also obtains, from the MRI apparatus 100, the image taking parameters used when the original data of these images were acquired by implementing the MP2RAGE method and the conversion tables generated on the basis of the image taking parameters. The conversion tables in the present example are, as explained in the first embodiment, the conversion table used for converting values between the complex product signal values and the T1 values and the conversion table used for converting values between the complex ratio signal values and the T1 values. The obtaining function 351 may obtain both the image taking parameters and the conversion tables or may obtain only one selected from therebetween. When obtaining only the image taking parameters, the obtaining function 351 further has a function of generating the conversion tables from the obtained image taking parameters, similarly to the setting function 13a explained in the first embodiment.

After that, the obtaining function 351 inputs the MP2RAGE image 43, the ratio image 44, and the conversion tables to the deriving function 352. For example, the obtaining function 351 stores the images obtained from the MRI apparatus 100 into the storage circuitry 320, whereas the deriving function 352 reads and receives inputs of various types of information stored in the storage circuitry 320.

Further, the deriving function 352 generates a T1 map by calculating a T1 value for each of the pixels by using the MP2RAGE image 43, the ratio image 44, and the conversion tables input thereto. In this situation, by using the MP2RAGE image 43, the ratio image 44, and the conversion tables, the deriving function 352 generates the T1 map by using the same method as the method used by the deriving function 15c explained in the first embodiment.

In this situation, for example, in the third embodiment also, the deriving function 352 does not necessarily have to select the T1 value on the basis of the relationship between the signal intensities and the T1 values of each pixel in the MP2RAGE image and the relationship between the signal intensities and the T1 values of each pixel in the ratio image. The deriving function 352 may select the T1 value, by using only the relationship between the signal intensities and the T1 values of each pixel in the ratio image.

Further, for example, when the MRI apparatus 100 has the functions explained in the second embodiment, the obtaining function may obtain the mask image 94 from the MRI apparatus 100, in place of the ratio image 44.

Figure 16:
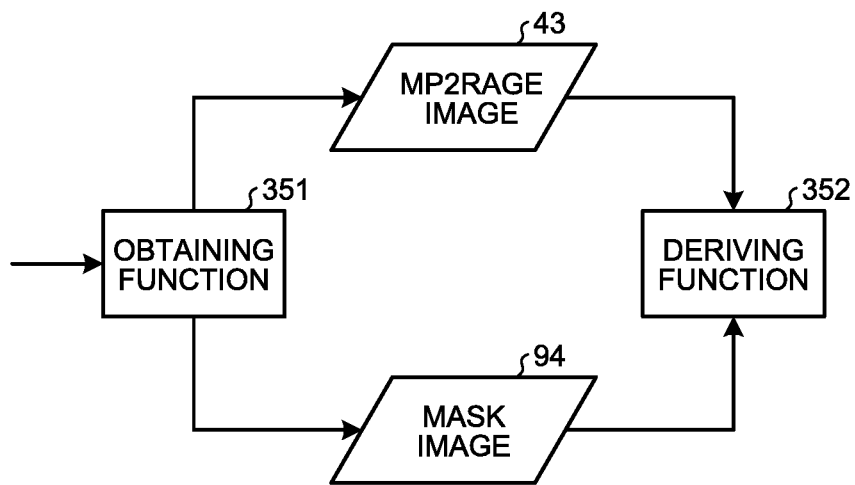
FIG. 16 is a drawing for explaining details of the obtaining function and the deriving function according to the third embodiment.

FIG. 16 is a drawing for explaining details of the obtaining function and the deriving function according to the third embodiment. For example, as illustrated in FIG. 16, the obtaining function 351 obtains the MP2RAGE image 43 and the mask image 94 from the MRI apparatus 100.

In this situation, similarly to the example described above, together with the MP2RAGE image 43 and the mask image 94, the obtaining function 351 also obtains, from the MRI apparatus 100, the image taking parameters used when the original data of these images were acquired by implementing the MP2RAGE method and the conversion tables generated on the basis of the image taking parameters. In this situation also, the obtaining function 351 may obtain both the image taking parameters and the conversion tables or may obtain only one selected from therebetween. When obtaining only the image taking parameters, the obtaining function 351 further has a function of generating the conversion tables from the obtained image taking parameters.

After that, the obtaining function 351 inputs the MP2RAGE image 43, the mask image 94, and the conversion tables to the deriving function 352. For example, similarly to the example described above, the obtaining function 351 stores the images obtained from the MRI apparatus 100 into the storage circuitry 320, whereas the deriving function 352 reads and receives inputs of various types of information stored in the storage circuitry 320.

Further, the deriving function 352 generates a T1 map by calculating a T1 value for each of the pixels by using the MP2RAGE image 43, the mask image 94, and the conversion tables input thereto. In this situation, by using the MP2RAGE image 43, the mask image 94, and the conversion tables, the deriving function 352 generates the T1 map by using the same method as the method used by the deriving function 15c explained in the second embodiment.

In the example described above, the obtaining function 351 obtains the MP2RAGE image 43, the ratio image 44, the mask image 94, the image taking parameters, and the conversion tables from the MRI apparatus 100; however, possible embodiments are not limited to this example. For instance, when these pieces of information are stored in the image storing apparatus 200, the obtaining function 351 may obtain the images from the image storing apparatus 200.

Further, for example, the pieces of information transmitted from the MRI apparatus 100 to the image processing apparatus 300 such as the mask image, the image taking parameters, and the conversion tables are transmitted as being appended to the data of the corresponding MP2RAGE image as additional information to the MP2RAGE image. For example, when a data communication compliant with a Digital Imaging and Communication in Medicine (DICOM) standard is performed between the MRI apparatus 100 and the image processing apparatus 300, the pieces of information may be transmitted as being configured into items of additional information prepared in a DICOM format.

Further, the pieces of information transmitted from the MRI apparatus 100 to the obtaining function 351 may be transmitted at the time when the MRI apparatus 100 has generated the pieces of information. Alternatively, the obtaining function 351 may obtain the pieces of information from the MRI apparatus 100 by sending a transmission request to the MRI apparatus 100 in response to an instruction from the operator.

According to the third embodiment described above, it is possible to realize the T1 mapping method having a higher level of precision, similarly to the first and the second embodiments.

Further, according to the third embodiment, when the obtaining function 351 is configured to obtain the mask image 94 from the MRI apparatus 100, it is also possible to achieve advantageous effects where the transfer time period is shortened and cumbersomeness during the operations is reduced, compared to the situation where the obtaining function 351 is configured to obtain the ratio image 44.

In the embodiments described above, it is possible to realize the T1 mapping method having a higher level of precision in which the folding of the T1 values is appropriately handled, by utilizing the characteristics of the MP2RAGE image that is less easily influenced by the B1 non-uniformity. Further, it is also possible to generate an accurate T1 map even under a condition where the folding of the T1 values occurs more easily, e.g., while a smaller flip angle is used or while shorter time intervals between the IR pulses are used. Accordingly, it is possible to realize the T1 mapping method implementing the MP2RAGE method that is less influenced by the B1 non-uniformity or the T1 mapping method implementing the MP2RAGE method that requires a shorter image taking time period.

In the embodiments described above, the example is explained in which the MP2RAGE image obtained as a real image is input to the deriving function; however, possible embodiments are not limited to this example. For instance, the deriving function may receive an input of an MP2RAGE signal that is still in the form of a complex image.

Further, the term "processor" used in the above embodiments denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). It is also acceptable to directly incorporate the programs into the circuit of the processor, instead of storing the programs in the storage circuitry. In that situation, the processor realizes the functions by reading and executing the programs incorporated in the circuit thereof. Further, as for the processors according to any of the embodiments, each of the processors may be structured as a single circuit. Alternatively, it is also acceptable to realize the functions thereof by structuring a single processor by combining together a plurality of independent circuits.

According to at least one aspect of the embodiments described above, it is possible to realize the T1 mapping method having a high level of precision.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance (MRI) image processing apparatus comprising
processing circuitry configured to:
obtain a complex product signal value and a complex ratio signal value calculated in units of pixels by using first data and second data successively acquired while implementing a gradient echo method after an Inversion Recovery (IR) pulse is applied, the complex product signal value representing a signal value obtained by calculating a complex product between a signal value of the first data and a signal value of the second data, the complex ratio signal value representing a signal value obtained by calculating a complex ratio between a signal value of the first data and a signal value of the second data; and derive a T1 value of each of the pixels, wherein the processing circuitry identifies a T1 value corresponding to the obtained complex ratio signal value, based on a predetermined relationship between complex ratio signal values and T1 values, wherein the relationship is a relationship according to which one T1 value is identified with respect to one complex ratio signal value, and selects, based on the identified T1 value, a T1 value from a plurality of T1 values each corresponding to the obtained complex product signal value to derive the T1 value of each of the pixels.

2. The MRI processing apparatus according to claim 1, wherein the first data and the second data are subsets of data acquired by using different Inversion Time (TI) periods.

3. The MRI processing apparatus according to claim 1, wherein the processing circuitry selects the T1 value from among a plurality of candidates for the T1 value corresponding to the obtained complex product signal value, based on the identified T1 value.

4. The MRI processing apparatus according to claim 3, wherein the processing circuitry selects the T1 value from among the plurality of candidates, based on a relationship between complex product signal values and T1 values and the relationship between complex ratio signal values and T1 values, the relationships being obtained from image taking parameters used when the first data and the second data were acquired.

5. The MRI processing apparatus according to claim 4, wherein the processing circuitry selects the T1 value being closer to the identified T1 value from among the plurality of candidates.

6. The MRI processing apparatus according to claim 4, wherein the processing circuitry identifies a T1 value at a boundary where folding of the T1 value occurs, based on the relationship between the complex product signal values and the T1 values, the processing circuitry identifies a reference complex ratio signal value indicating a complex ratio signal value corresponding to the T1 value at the boundary, based on the relationship between the complex ratio signal values and the T1 values, and the processing circuitry selects the T1 value from among the plurality of candidates depending on whether the calculated complex ratio signal value is larger or smaller than the reference complex ratio signal value.

7. The MRI processing apparatus according to claim 6, wherein the processing circuitry generates a mask image that has set therein a pixel value indicating whether or not the folding of the T1 value has occurred depending on whether the calculated complex ratio signal value is larger or smaller than the reference complex ratio signal value, and the processing circuitry selects the T1 value from among the plurality of candidates with respect to each of one or more pixels for which a pixel value indicating that the folding has occurred is set in the mask image.

8. The MRI processing apparatus according to claim 1, wherein the processing circuitry calculates the complex product signal values by dividing a value obtained by multiplying the signal value of the first data by the signal value of the second data, by a value obtained by adding a squared signal value of the first data to a squared signal value of the second data, and the processing circuitry calculates the complex ratio signal value by dividing the signal value of the first data by the signal value of the second data.

* * * * *